(12) United States Patent
Oosaka

(10) Patent No.: US 7,986,542 B2
(45) Date of Patent: Jul. 26, 2011

(54) SEMICONDUCTOR MEMORY APPARATUS

(75) Inventor: Masashi Oosaka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/073,847

(22) Filed: Mar. 11, 2008

(65) Prior Publication Data

US 2008/0198683 A1 Aug. 21, 2008

Related U.S. Application Data

(62) Division of application No. 11/342,532, filed on Jan. 31, 2006, now Pat. No. 7,692,942.

(30) Foreign Application Priority Data

Dec. 1, 2005 (JP) .................................. 2005-348006

(51) Int. Cl.
G11C 5/06 (2006.01)
G11C 8/00 (2006.01)

(52) U.S. Cl. .................. 365/63; 365/230.03; 365/230.06

(58) Field of Classification Search ............. 365/230.03, 365/230.06, 63, 149, 226; 257/401
See application file for complete search history.

(56) References Cited

U.S. PATENT DOCUMENTS

| 5,021,998 | A | | 6/1991 | Suzuki | |
|---|---|---|---|---|---|
| 5,295,106 | A | * | 3/1994 | Jinbo | 365/230.06 |
| 5,519,665 | A | * | 5/1996 | Chishiki | 365/230.06 |
| 5,543,883 | A | | 8/1996 | Green | |
| 5,598,363 | A | | 1/1997 | Uchida | |
| 5,734,188 | A | * | 3/1998 | Murata et al. | 257/401 |
| 5,812,483 | A | * | 9/1998 | Jeon et al. | 365/230.06 |
| 5,903,022 | A | | 5/1999 | Takashima | |
| 5,970,016 | A | * | 10/1999 | Ohsawa | 365/230.06 |
| 5,978,291 | A | * | 11/1999 | Kirihata | 365/230.06 |
| 6,049,499 | A | | 4/2000 | Sukegawa | |
| 6,104,630 | A | | 8/2000 | Hidaka | |
| 6,219,297 | B1 | * | 4/2001 | Cho et al. | 365/230.06 |
| 6,222,995 | B1 | | 4/2001 | Ochida | |
| 6,246,630 | B1 | * | 6/2001 | Hosokawa et al. | 365/230.06 |
| 6,378,118 | B1 | | 4/2002 | Sugibayashi | |
| 6,452,860 | B2 | * | 9/2002 | Wada et al. | 365/230.06 |
| 6,529,406 | B1 | | 3/2003 | Namekawa | |
| 6,661,700 | B2 | * | 12/2003 | Taniguchi | 365/149 |
| 6,687,174 | B2 | | 2/2004 | Maruyama | |

(Continued)

FOREIGN PATENT DOCUMENTS

JP 08-330536 12/1996

(Continued)

OTHER PUBLICATIONS

Japanese Office Action of Dec. 21, 2010 in corresponding Japanese Application No. 2005-348006 with English translation of wavy-lined portion.

*Primary Examiner* — Trong Phan

(74) *Attorney, Agent, or Firm* — Young & Thompson

(57) ABSTRACT

A semiconductor memory that includes a row decoder part, a first cell array placed on either side of the row decoder part, a second cell array placed on the other side of the row decoder part, and a wiring layer that short-circuits word lines corresponding to a specified row address on the first cell array with word lines corresponding to a specified row address on the second cell array.

5 Claims, 6 Drawing Sheets

U.S. PATENT DOCUMENTS

| | | |
|---|---|---|
| 6,785,181 B2 | 8/2004 | Karasawa |
| 6,845,028 B2 | 1/2005 | Takemura |
| 6,856,550 B2 * | 2/2005 | Kato et al. ............... 365/230.03 |
| 6,868,034 B2 * | 3/2005 | La et al. ................... 365/230.06 |
| 6,898,110 B2 | 5/2005 | Ishimatsu |
| 7,002,866 B2 | 2/2006 | Hirose |
| 7,245,158 B2 | 7/2007 | Yang |

FOREIGN PATENT DOCUMENTS

| | | |
|---|---|---|
| JP | 11-340438 | 12/1999 |
| JP | 2000-133777 | 5/2000 |
| JP | 2003-007852 | 1/2003 |

* cited by examiner

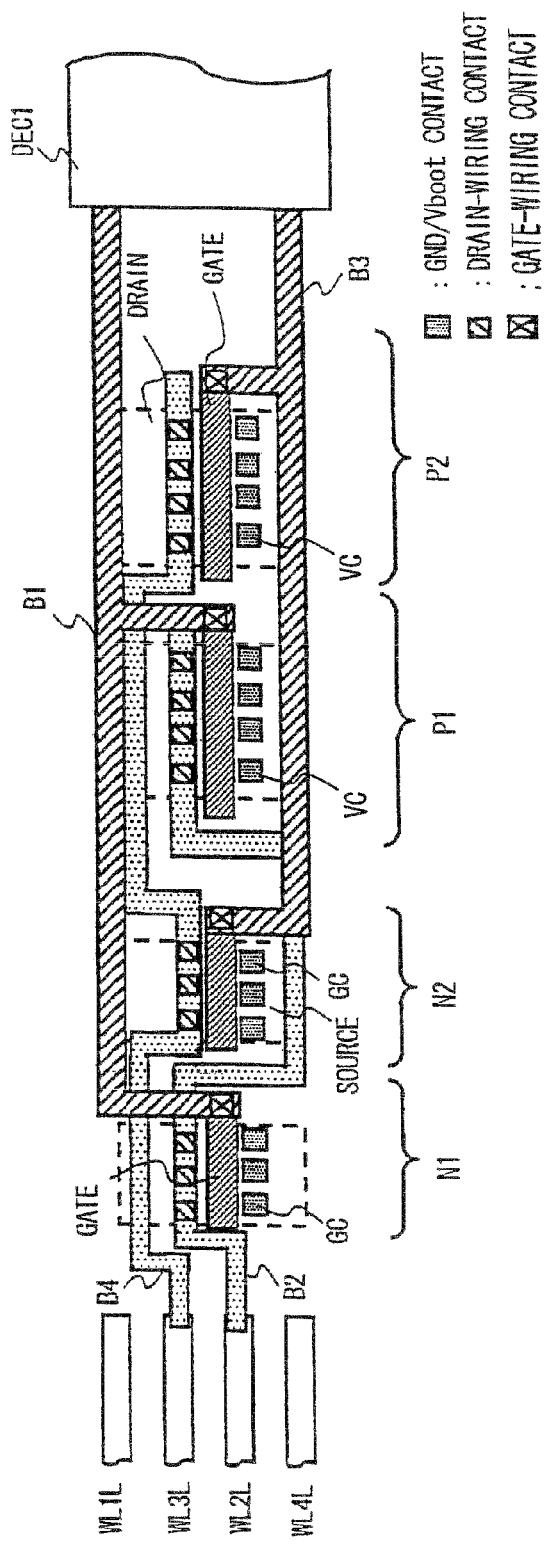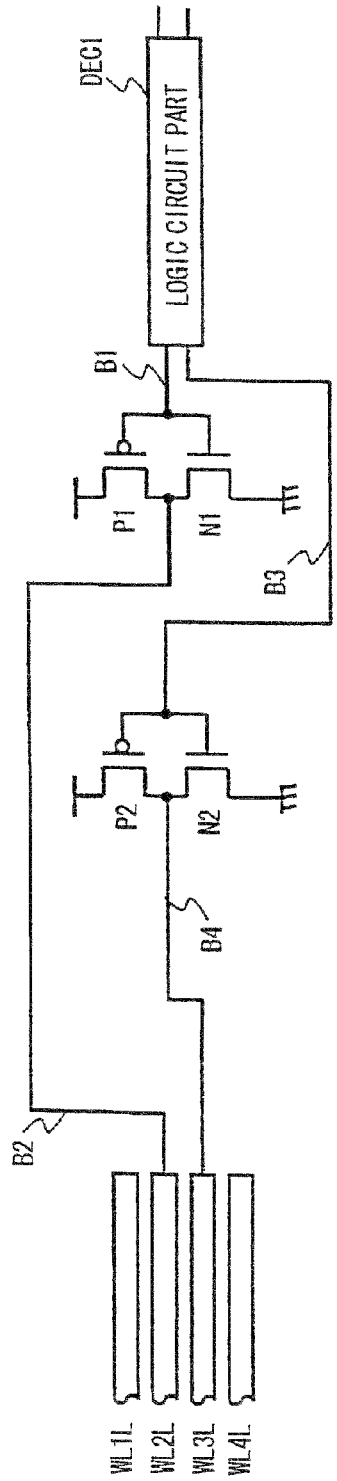
Fig. 5A
Fig. 5B

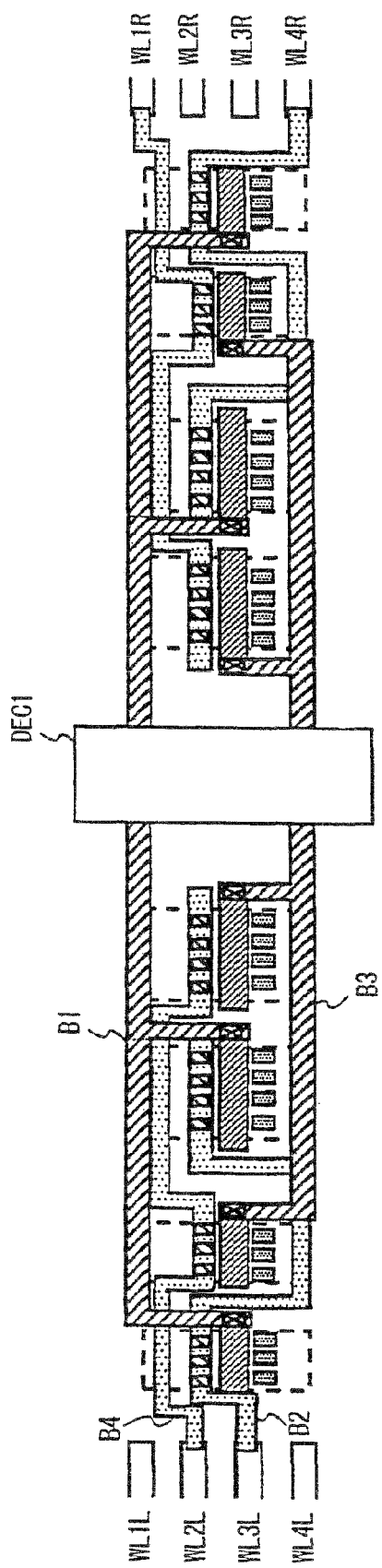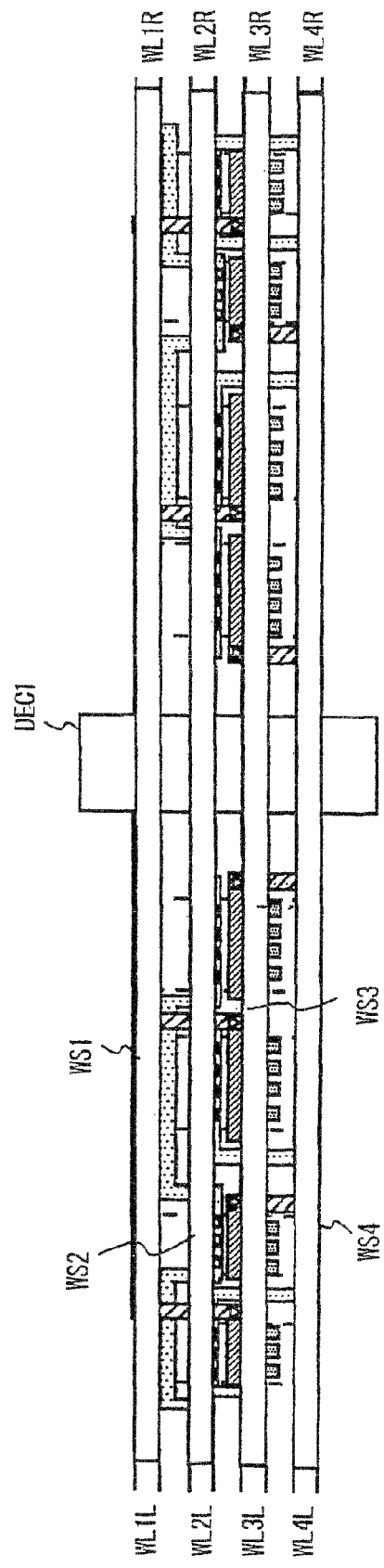
Fig. 6A
Fig. 6B

SEMICONDUCTOR MEMORY APPARATUS

BACKGROUND OF THE INVENTION

1. Field of the Invention

The present invention relates to a semiconductor integrated circuit and particularly to a semiconductor memory apparatus such as a memory circuit.

2. Description of Related Art

On a semiconductor memory apparatus of a related art, a plurality of memory cells are arranged in a matrix. Selecting addresses in row and column direction on the semiconductor memory apparatus reads or writes a memory cell of any position. On a semiconductor memory, a word line of a specified row direction is activated so as to read data on a bit line corresponding to a specified column or to write data to the specified bit line.

As disclosed in Japanese Unexamined Patent Publication No. 2000-133777, there is a known method when placing memory cells of the semiconductor memory apparatus in a matrix, of which placing a decoder and a word line driver to drive word line on the central part of the memory cells. Placing a row decoder and a word line driver on the central part reduces the length of a word line to half and also enables a semiconductor memory to speed up.

However when placing memory cells in this manner, a word line driver to activate a word line must be set up on the left and right sides, thereby requiring a large area in word line driver layout. To reduce the area of the word line driver, a common word line driver may be used to drive both sides of the word lines.

However in a case for example where a memory cell is a DRAM, a pitch between word lines on a memory cell part is too narrow for arranging a row decoder part and a common word line driver in accordance with the pitch on the memory cell part. Consequently it does not leave a sufficient space in the layout of the row decoder part, thereby making it impossible to arrange a word line to pass through the row decoder part unless extending the pitch between word lines or adding a new wiring layer. Accordingly in the related art, a row decoder is placed on the central part and word line drivers on the left and right sides, and then extending the word lines towards left and right direction. However if a pitch between word lines is narrow, a word line driver has to be arranged widely in a word line direction because of the pitch, thus increasing the row decoder area relatively and also preventing from reducing the area of the overall memory cell part.

SUMMARY OF THE INVENTION

According to an aspect of the present invention, there is provided a semiconductor memory that includes a row decoder part, a first cell array placed on either side of the row decoder part, a second cell array placed on the other side of the row decoder part, and a wiring layer that short-circuits word lines corresponding to a specified row address on the first cell array with word lines corresponding to a specified row address on the second cell array.

The technology also pertains to a semiconductor memory device that includes a first memory cell array including a plurality of first word lines, a second memory cell array including a plurality of second word lines, and a row decoder being arranged between said first memory cell array and said second memory cell array, said row decoder including a plurality of first word line drivers and a plurality of second word line drivers at both sides thereof, respectively. The plurality of first word line drivers and said plurality of second word line drivers are disposed within an area corresponding to a pitch of one of said plurality of first word lines and said plurality of second word lines, such that there is no need to mount one of said first word line drivers and said second word line drivers to each of said first word line and said second word lines placed on one side of the row decoder. A number of said first word line drivers is less than a number of said first word lines, a number of said second word line drivers is less than a number of said second word lines, and an upper wiring is configured to short circuit said first and second word lines.

This configuration allows word lines on both sides adjacent to the decoder part to be driven by a common word line driver.

BRIEF DESCRIPTION OF THE DRAWINGS

The above and other objects, advantages and features of the present invention will be more apparent from the following description taken in conjunction with the accompanying drawings, in which:

FIG. 5A is a top view showing the configuration of the embodiment of the present invention;

FIG. 5B is a circuit diagram showing the wiring connection of the embodiment of the present invention;

FIG. 6A is a top view showing the wiring configuration of the embodiment of the present invention; and FIG. 6B is a top view showing the wiring configuration of the embodiment of the present invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1A:
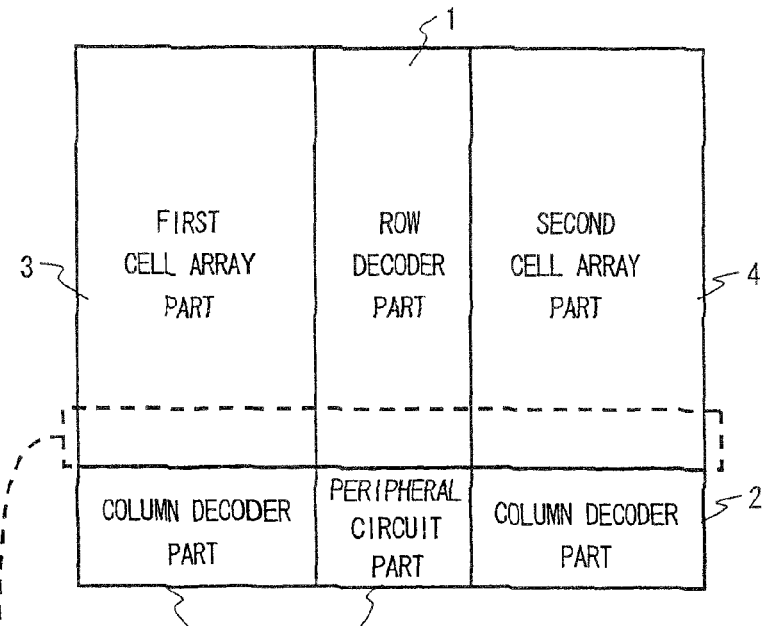
FIG. 1A is a top view showing the configuration of the embodiment of the present invention.
Figure 1B:
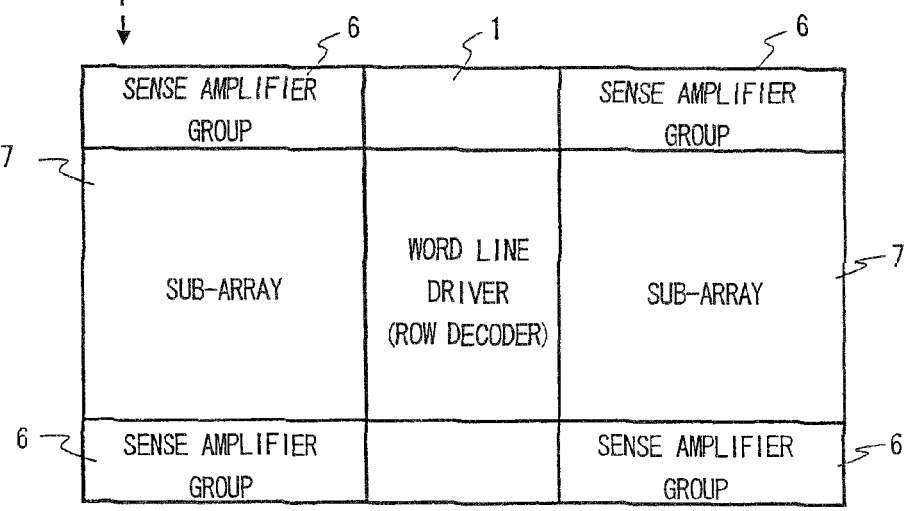
FIG. 1B is a top view showing the configuration of the embodiment of the present invention.
Figure 2A:
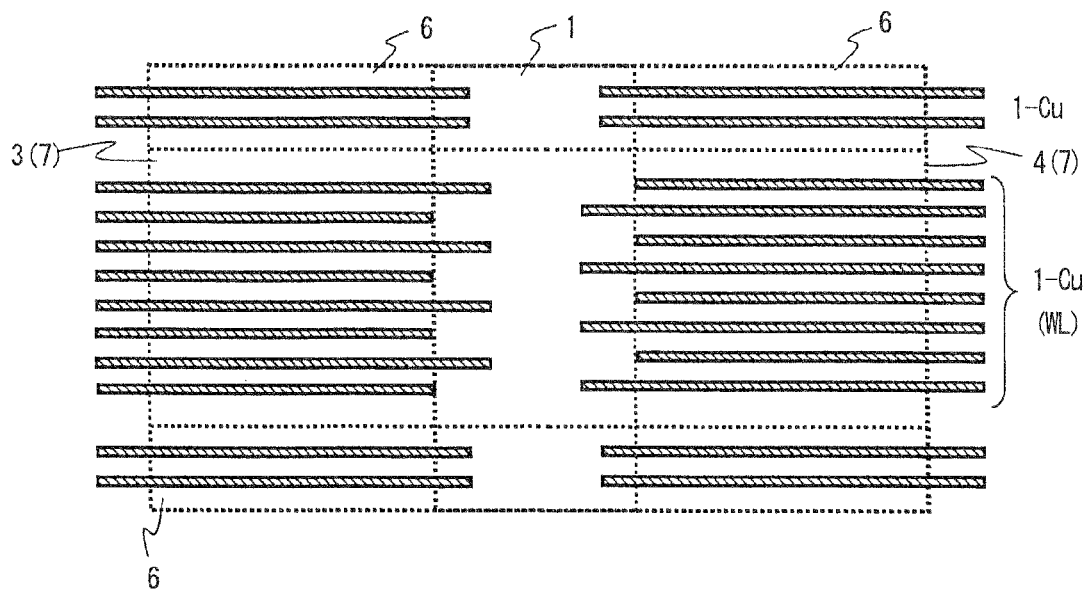
FIG. 2A is a top view showing the wiring configuration of the embodiment of the present invention.
Figure 2B:
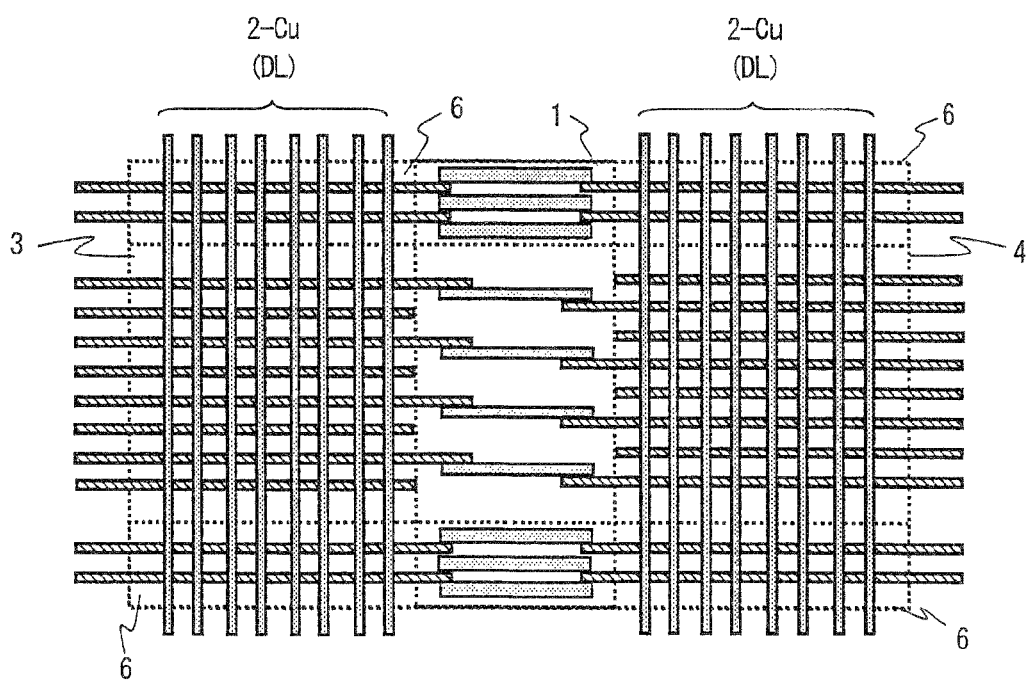
FIG. 2B is a top view showing the wiring configuration of the embodiment of the present invention.

FIGS. 1A and 1B are the top views showing a semiconductor memory apparatus according to an embodiment of the present invention. As shown in FIG. 1A, the semiconductor memory of this embodiment includes a row decoder part 1, a column decoder part 2, a first and a second cell array part 3 and 4, and a peripheral circuit part 5.

The first cell array part 3 and the second cell array part 4 are placed at both sides of the row decoder part 1. The column decoder part 2 is placed at the bottom of the first and the second cell array part 3 and 4. The peripheral circuit part 5 is placed at the bottom of the row decoder part 1. In the semiconductor memory apparatus of this embodiment, sense amplifier groups 6 are placed in a row direction (horizontal direction in FIG. 1A) at every several lines on the cell array part 3 and 4 (See FIG. 1B). If the cell array part 3 placed in between the sense amplifier groups 6 is referred to as a sub-array 7, the sub-array 7 and the sense amplifier groups 6 that are placed at both sides of the row decoder part 1 as shown in FIG. 1B are repeatedly placed in a vertical direction in FIG. 1A to form the semiconductor memory apparatus of this embodiment.

FIGS. 2A, 2B, 3A, and 3B are the views schematically showing each wiring layer formed on this semiconductor memory apparatus. FIGS. 2A, 2B, 3A, and 3B are the schematic views of wiring illustrated to help understand the present invention. Accordingly patterns of each layer are not limited to the drawings. Using the cell array layout shown in FIG. 1B as an example, wirings of each layer for this invention will be described.

A plurality of memory cells are arranged in a matrix on the first and the second cell array 3 and 4 (sub-array 7). The memory cells lined up in a row direction are connected with a common word line WL. This word line WL is placed horizontally on the drawing (See FIG. 2A). This word line is formed by a metal wiring of the first layer (in this case the word line is copper wiring and is indicated by 1-Cu). The memory cells lined up in a column direction are connected with a common data line DL through a sense amplifier. A bit line that connects a memory cell and a sense amplifier is connected at a special metal wire layer located at a lower layer than 1-Cu, which is not illustrated in the figure. This data line DL is placed vertically, traversing the cell array parts 3 and 4 (See FIG. 2B). This data line DL is formed by a metal wiring (2-Cu) of the second layer over the first wiring layer, for example.

A plurality of transistors are formed in the row decoder part 1 according to this embodiment. These transistors are for example the ones to form a logic circuit that selects a row specified by a row address signal, and also to form a word line driver that drives a word line of a selected row. These transistors are connected by the metal wiring 1-Cu and 2-Cu of the first and the second layers, forming a logic circuit and a driver.

A plurality of transistors are formed in the column decoder part 2 and peripheral circuit part 5 in a similar manner, and the wirings of the first and the second layers form a logic circuit.

On a semiconductor memory apparatus according to this embodiment, the wiring of the third layer (3-Cu) over the wiring of the second layer forms a power supply wiring and a signal wire to compose a power supply mesh. The power supply wiring formed by the wiring of the third layer is the wiring to supply a cell array part, for example, with ground potential GND and power supply voltage Vcc. Since power Vboot, a boosted power supply voltage, is used to drive word lines, this boosted Vboot is supplied using the wiring of the third layer for word line driver of the row decoder part 1. The wiring of the third layer is also used as a signal wiring that supplies a signal including an address or timing to the row decoder part 1.

The fourth wiring layer (4-Cu) is formed over the wiring of the third layer. In this embodiment, the wiring of the fourth layer is basically a power supply wiring composing a power mesh that supplies power supply voltage Vcc and ground potential GND to the cell array part 3, the row decoder part 1 and the column decoder part 2 and the like. In a conventional art, the fourth wiring layer is used as a power supply wiring even over a row decoder part 1 and a word line driver. However in this embodiment, the fourth wiring layer formed over the row decoder part 1 and the word line driver is not used as a power supply wiring. The fourth wiring layer over the row decoder part 1 is formed as a wiring to short-circuit the word lines with the same row address on both sides of the row decoder part 1. As for the row decoder part, this configuration is based on the result of a consideration that it allows sufficient power supply with the other power supply wiring layers including 3-Cu, and when using the fourth wiring layer on top of the row decoder part for short-circuiting, the left and right word line driver can be shared without adding another wiring layer. The wiring of the fourth layer is used as a power supply wiring over the sense amplifier group 6 so as to supply power supply voltage Vcc and ground potential GND.

Figure 3A:
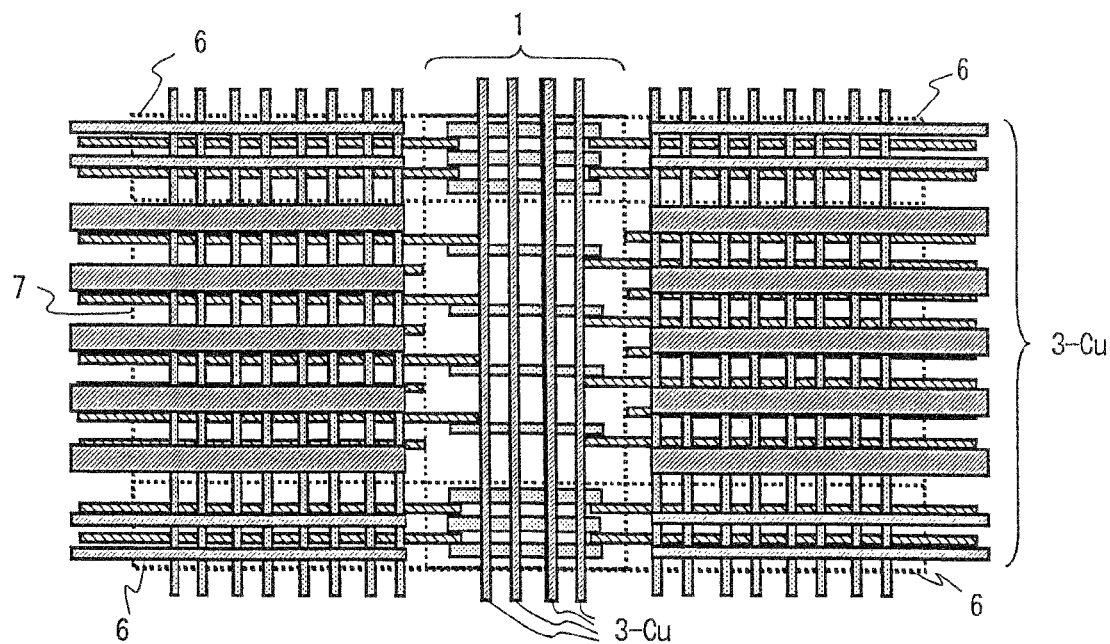
FIG. 3A is a top view showing the wiring configuration of the embodiment of the present invention.
Figure 3B:
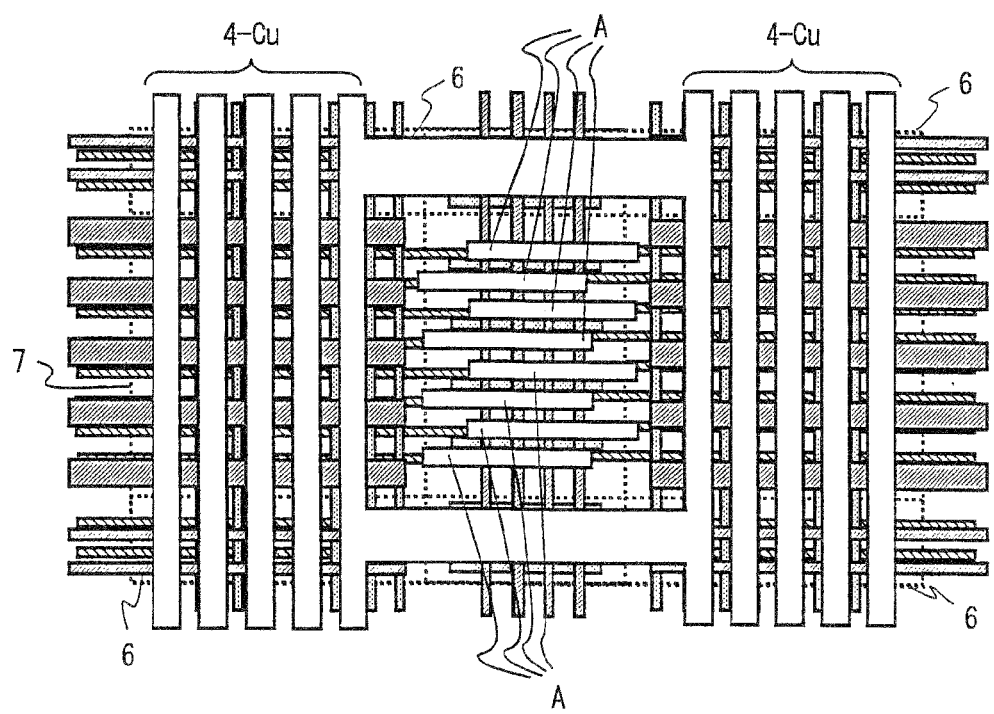
FIG. 3B is a top view showing the wiring configuration of the embodiment of the present invention.

In FIG. 3B, although the wiring of the fourth layer is illustrated where a power supply wiring is connected to another power supply wiring of the fourth layer (4-Cu) which is over the sense amplifier, the fourth wiring layer for power mesh may be composed on the sense amplifier to connect any power supply wiring of the third layer.

As described above, the fourth wiring layer formed over the row decoder part 1 and the word line driver is not used as a power supply wiring but is formed as a wiring to short-circuit the word lines with the same row address on both sides of the row decoder part 1. In other words, the fourth wiring layer (4-Cu) indicated by A in FIG. 3B short-circuits the word lines of both sides whose row addresses are the same. By using the wiring of the fourth layer in the way explained above, the left and right word lines formed beside the row decoder 1 are short-circuited, thus enabling single word line driver to drive such a word line corresponding to any row address. A word line is driven by power Vboot, boosted Vcc, and not by power supply voltage Vcc. A plurality of word lines are not basically driven at the same time, but only a single word line corresponding to a specified row address is selected to be driven. For this reason, no power mesh in order to reinforce power supply wiring is especially needed over word line driver. Since the wirings of the first and the second layer formed over the row decoder part 1 in order to configure a row decoder and a driver circuit are wired in the same layer as word lines and data lines, it is extremely difficult to short-circuit the word lines placed on the left and right side using 1-Cu or 2-Cu that are formed on the row decoder part 1. However using an upper wiring used for power mesh layer which requires no power reinforcement in order to short-circuit allows the word lines to be short-circuited with a remarkably simple wiring pattern.

Figure 4:
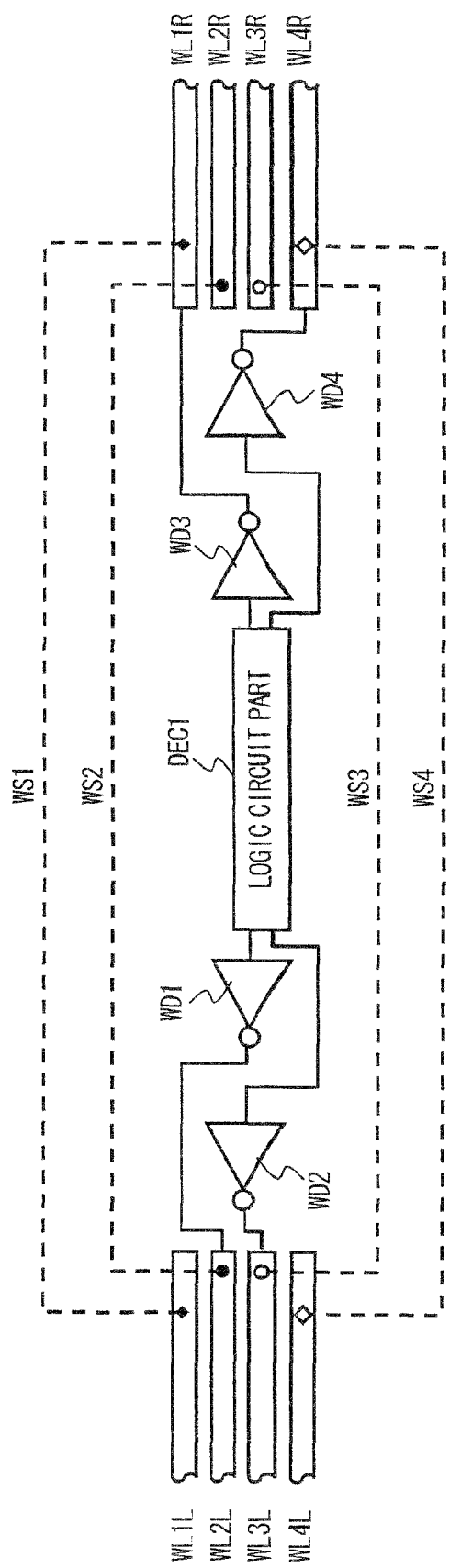
FIG. 4 is a view showing the wiring connection of the embodiment of the present invention.

The embodiment of this invention is further described hereinafter. FIG. 4 is a circuit diagram to describe more specific layout structure. FIG. 5A is a top view showing more specific layout structure detailing the configuration illustrated in FIG. 1 to FIG. 3. The embodiment of this invention is further described hereinafter using FIGS. 4 and 5A. FIGS. 4 and 5A use an example of driving four word lines, WL1 to WL4.

As shown in FIG. 4, the semiconductor memory apparatus of this embodiment includes DEC1, a logic circuit part such as decoder, four word line drivers WD1 to WD4, word lines WL1L to WL4L, WL1R to WL4R and WS1 to WS4. The word lines WL1L to WL4L and WL1R to WL4R are the wirings formed in 1-Cu, the wiring of the first layer described above, while WS1 to WS4 are the wirings to short-circuit the left and right word lines that are formed of 4-Cu, the wiring of the fourth layer.

As shown in FIG. 4, a logic circuit part DEC1 is placed on the central part. On one side of the logic circuit part DEC1 (left side of the figure), the first and second word line driver WD1 and WD2 are placed. On the other side of the logic circuit part DEC1 (right side of the figure), the third and the fourth word line driver WD3 and WD4 are placed. This logic circuit part and word line driver part are equivalent to the row decoder part 1 of FIG. 1. On one side of this row decoder part 1 (left side of the figure), word lines WL1L to WL4L of the cell array part 3 are placed and on the other side (right side of the figure), WL1R to WL4R of the cell array part 4 are placed. Here the word lines WL1L to WL4L are connected with WL1R to WL4R respectively through the wiring of the fourth layer, WS1 to WS4. In FIG. 4, the wirings of the fourth layer WS1 to WS4 are indicated by broken lines. As described using FIG. 1 to FIG. 3, the wirings of the second and third layers (2-Cu, 3-Cu) are also formed but are not illustrated in FIG. 4.

The layout of the structure shown in FIG. 4 is described using FIG. 5A. In FIG. 5A, only the word line drivers WD1 and WD2 (left side of the logic circuit part DEC1 in FIG. 4) are illustrated. As shown in FIG. 5A, a first and a second NMOS transistor N1 and N2, and also a first and a second PMOS transistor P1 and P2 are placed in between the logic circuit part DEC1 and word line WL1L to WL4L. Each transistor has a gate electrode, a drain and a source. In this example, the word line driver WD1 illustrated in FIG. 4 is formed using the first NMOS transistor N1 and the first PMOS transistor P1, while the word line driver WD2 is formed using the second NMOS transistor N2 and the second PMOS transistor P2.

FIG. 5A is a schematic view showing the layout when the NMOS transistor N1 and the PMOS transistor P1 form the word line driver WD1, and the NMOS transistor N2 and the PMOS transistor P2 form the word line driver WD2 as described above. As FIG. 5A indicates, a line B1 is formed by 2-Cu of the second layer, for example, and is connected to the gates of the transistors N1 and P1 via a contact. The drains of the transistor N1 and P1 are connected to a line B2 formed by 1-Cu, for example, via a contact. The drains of the transistor N1 and P1 are connected to the word line WL2L by the line B2. A line B3 is connected to the gate of transistor N2 and P2 via a contact. The drains of transistor N2 and P2 are connected to a line B4 via a contact. The drains of transistor N2 and P3 are connected to the word line WL3L via the line B4.

The sources of the NMOS transistor N1 and N2 are connected to the ground potential GND via a contact GC, while the source of the PMOS transistor P1 and P2 are connected to the boosted power Vboot via a contact VC. Depiction of this layout into a circuit diagram is the FIG. 5B.

Since the contact GC and VC which are formed on the source reach to the power supply wiring of the third layer from the diffusion region of the source, it is extremely difficult to connect word lines on the left and right side such as WL1L and WL1R for the decoder part using the wiring of the lower layers including the first or the second layer.

Furthermore the lower layers such as 1-Cu and 2-Cu are used for the wiring of the driver part as illustrated in the figure and for forming a logic circuit of the decoder part (not illustrated in the figure), it is impossible to cut across those wirings and connect the left and right side word lines using 1-Cu or 2-Cu and the like. Accordingly in this embodiment, left and right word lines are connected by an upper wiring line for the logic circuit part.

As shown in FIG. 4, since the word line WL2L is connected to the WL2R via a line WS2 of the fourth layer, the word lines WL2 (WL2L, WL2R) placed in both sides of the row decoder part 1 can be driven by the word line driver WD1. In like wise, the word line driver WD2 can be used to drive the word lines WL3L and WL3R. Although FIG. 5 details only the word line driver mounted to the left side of the logic circuit part DEC1, basically the word line drivers WD3 and WD4 will be placed in the same way. However the line to be an output of the word line driver WD3 is connected to the word line WL1R, while the line to be an output of the word line driver WD4 is connected to the word line WL4R. FIG. 6A is the overall layout when connected in this manner. Furthermore FIG. 6B is a top view when short-circuiting the left and right word lines using the lines WS1 to WS4 of the fourth layer.

As stated in this embodiment, the first and the second word line driver WD1 and WD2 are placed on one side of the logic circuit part DEC 1, where the drivers are connected to the word line WL2L and WL3L respectively which are placed on the one side of the row decoder part. The third and the fourth word line drivers are placed on the other side of the logic circuit part DEC 1, where the drivers are connected to the word line WL1R and WL4R respectively which are placed on the other side of the logic circuit part. The word lines corresponding to the same row address (WL1R to WL1L, WL2R to WL2L, WL3R to WL3L, WL4R to WL4L) are connected via the lines of the fourth layer, WS1 to WS4 respectively, thereby enabling the word line driver WD1 or WD2 placed on one side of the row decoder part (left side of the figure) to drive the word line (WL2R or WL3R) placed on the other side of the row decoder part (right side of the figure), for example.

The configuration and the wiring described above eliminate the need to mount a word line driver to each word line placed on one side of the row decoder part, reduce the number of word line driver and also narrow a circuit area. A plurality of the layout indicated in FIG. 6A are repeatedly configured in a column direction (vertical direction in FIG. 1) on the semiconductor memory apparatus according to this embodiment.

As this embodiment is specifically described according to the present invention, there is no need to provide a word line driver for each of the left lines and each of right word lines on the row decoder part as for the semiconductor memory apparatus on which the word lines are placed on both sides of the row decoder part, accordingly reducing the circuit area. It also enables a circuit structure to be simpler, hence capable of achieving the higher speed semiconductor memory apparatus. Further, this invention uses an upper wiring to short-circuit the left and the right word lines, thus achieving to reduce the number of the word line driver with a fairly simple structure (in this embodiment, two contacts that connect the left and right wirings of the first layer with the wiring of the fourth layer).

Though a preferred embodiment of the present invention is described in detail in the foregoing, the present invention is not restricted to the above-mentioned embodiment but various changes may be made. For instance in this embodiment, the wiring of the fourth layer is wired to short-circuit word lines, but it may be configured on the other layer. For example the wiring of the fifth layer may have a configuration to cut across the row decoder part to short-circuit the word lines on the left and right side.

It is apparent that the present invention is not limited to the above embodiment and it may be modified and changed without departing from the scope and spirit of the invention.

I claim:

1. A semiconductor memory device, comprising:
   a first memory cell array including a plurality of first word lines;
   a second memory cell array including a plurality of second word lines; and
   a row decoder being arranged between said first memory cell array and said second memory cell array, said row decoder including a plurality of first word line drivers and a plurality of second word line drivers at both sides thereof, respectively;
   wherein said plurality of first word line drivers and said plurality of second word line drivers are disposed within an area corresponding to a pitch of one of said plurality of first word lines and said plurality of second word lines, such that there is no need to mount one of said first word line drivers and said second word line drivers to each of said first word lines and said second word lines placed on one side of the row decoder, a number of said first word line drivers is less than a number of said first word lines, and wherein a number of said second word line drivers is less than a number of said second word lines, and an upper wiring is configured to short circuit said first and second word lines.

2. The semiconductor memory device as claimed in claim 1, wherein the plurality of first and second word lines include a wiring corresponding to a first row address, a second row address, a third row address and a fourth row address; and the plurality of first and second word line drivers are further defined to include the first word line driver, the second word line driver, a third word line driver and a fourth word line driver, wherein the first word line driver is driven by the wiring corresponding to the second row address of the first memory cell array, the second word line driver is driven by the wiring corresponding to the third row address of the first memory cell array, the third word line driver is driven by the wiring corresponding to the first row address of the second memory cell array and the fourth word line driver is driven by the wiring corresponding to the fourth row address of the second memory cell array.

3. A semiconductor memory device, comprising:

a row decoder including a plurality of first word line drivers and a plurality of second word line drivers;

a first word line coupled to a first word line driver of said plurality of first word line drivers; and a second word line coupled to a second word line driver of said plurality of second word line drivers, wherein said plurality of first word line drivers and said plurality of second word line drivers are disposed within an area corresponding to a pitch of one of said first word line and said second word line, such that there is no need to mount one of said first word line drivers and said second word line drivers to each of said first word line and said second word line placed on one side of the row decoder, said first word line and said second word line extend in a first direction and are adjacent to each other in a second direction perpendicular to said first direction, said first word line drivers are aligned with said second word line drivers in the first direction, each of said first and second word lines is a single layer except for a contact part, and an upper wiring is configured to short circuit said first word line and said and second word line.

4. The semiconductor memory device as claimed in claim 3, wherein said first and said second word line drivers are arranged in a same width in said second direction.

5. A semiconductor memory device, comprising:

a row decoder including a plurality of word line drivers;

a first word line coupled to a first word line driver of said plurality of word line drivers; and a second word line coupled to a second word line driver of said plurality of word line drivers, wherein said plurality of word line drivers are disposed within an area corresponding to a pitch of one of said first word line and said second word line, such that there is no need to mount one of said first word line driver and said second word line driver to each of said first word line and said second word line placed on one side of the row decoder, said first word line and said second word line extend in a first direction and are adjacent to each other in a second direction perpendicular to said first direction, said first word line drivers are aligned with said second word line drivers in the first direction, each of said first and second word lines is a single layer except for a contact part, said first and said second word line drivers are arranged in a same width in said second direction, and an upper wiring is configured to short circuit said first and second word lines.

* * * * *